United States Patent
Yokogawa et al.

(10) Patent No.: US 8,209,651 B2
(45) Date of Patent: Jun. 26, 2012

(54) WIRING LAYOUT DECISION METHOD OF INTEGRATED CIRCUIT

(75) Inventors: Shinji Yokogawa, Kanagawa (JP); Hideaki Tsuchiya, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 288 days.

(21) Appl. No.: 12/588,995

(22) Filed: Nov. 4, 2009

(65) Prior Publication Data
US 2010/0095258 A1    Apr. 15, 2010

(30) Foreign Application Priority Data
Oct. 11, 2008 (JP) .................................. 2008-287935

(51) Int. Cl.
*G06F 17/50* (2006.01)

(52) U.S. Cl. ........ 716/112; 716/100; 716/102; 716/106; 716/109; 716/115; 716/129; 716/132; 716/136; 716/137

(58) Field of Classification Search .................. 716/100, 716/102, 106, 109, 115, 129, 132, 136, 137, 716/112
See application file for complete search history.

(56) References Cited

U.S. PATENT DOCUMENTS

| | | | | |
|---|---|---|---|---|
| 6,424,959 B1* | 7/2002 | Bennett et al. | ................... | 706/13 |
| 6,587,061 B2* | 7/2003 | Petrofsky | ..................... | 341/143 |
| 6,629,295 B1* | 9/2003 | Akimoto et al. | ............... | 716/115 |
| 6,634,013 B2* | 10/2003 | Shinzawa | ...................... | 716/115 |
| 6,708,316 B2* | 3/2004 | Madni et al. | ................... | 716/115 |
| 6,774,685 B2* | 8/2004 | O'Toole et al. | ................ | 327/156 |
| 6,816,995 B2* | 11/2004 | Yokogawa | ....................... | 716/115 |
| 6,920,403 B2* | 7/2005 | Ootouge | ......................... | 702/60 |
| 7,290,224 B2* | 10/2007 | Byrn et al. | ...................... | 716/102 |
| 7,292,092 B2* | 11/2007 | De Ruijter | ..................... | 327/552 |
| 7,496,342 B2* | 2/2009 | Sorrells et al. | ................ | 455/313 |
| 7,631,283 B2* | 12/2009 | Hsu | ................................ | 716/129 |
| 7,810,059 B1* | 10/2010 | Trimberger | .................... | 716/136 |
| 7,836,418 B2* | 11/2010 | Binder et al. | .................. | 716/108 |
| 7,853,916 B1* | 12/2010 | Trimberger et al. | .......... | 716/117 |
| 7,890,893 B2* | 2/2011 | Bolam et al. | ................... | 716/102 |
| 7,900,163 B2* | 3/2011 | Weiner et al. | .................. | 716/132 |
| 7,966,587 B2* | 6/2011 | Tsuchiya et al. | .............. | 716/100 |
| 2008/0222588 A1* | 9/2008 | Nonaka et al. | ................... | 716/10 |
| 2009/0077508 A1* | 3/2009 | Rubin et al. | ....................... | 716/4 |

FOREIGN PATENT DOCUMENTS

JP                8-6980          1/1996

OTHER PUBLICATIONS

Chan et al.; "Impacts of high power induction heaters on power system"; Publication Year: 2006; Applied Power Electronics Conference and Exposition, 2006. APEC '06. Twenty-First Annual IEEE.*

(Continued)

*Primary Examiner* — Helen Rossoshek
(74) *Attorney, Agent, or Firm* — McGinn IP Law Group, PLLC

(57) ABSTRACT

A wiring layout method includes designing a layout of a power wiring for an integrated circuit; designing a layout of plural signal wirings for the integrated circuit; comparing the signal frequency; classifying the signal wirings; calculating an evaluation value of a temperature rise; and modifying the layouts of the integrated circuit.

10 Claims, 4 Drawing Sheets

OTHER PUBLICATIONS

Dolezel et al.; "Limit Operation Regimes of Selected Power Semiconductor Elements"; Publication Year: 2006; Power Electronics and Motion Control Conference, 2006. EPE-PEMC 2006. 12th International; pp. 50-53.*

Jang, E.; "Write frequency dependence of power loss in inductive heads"; Publication Year: 2003; Magnetics Conference, 2003. INTERMAG 2003. IEEE International; pp. CE-06.*

Shah et al.; "Temperature rise and fusing current in wire bonds for high power RF applications"; Publication Year: 2004; Thermal and Thermomechanical Phenomena in Electronic Systems, 2004. ITHERM '04. The Ninth Intersociety Conference on; pp. 157-164 vol. 1.*

* cited by examiner

CALCULATION OF Dp

WIRING LAYOUT DECISION METHOD OF INTEGRATED CIRCUIT

BACKGROUND OF THE INVENTION

1. Field of the Invention

The present invention relates to a wiring layout method and a computer readable medium storing a program executed by a computer to execute the layout method.

2. Description of the Related Art

In recent years, integrated circuits are becoming smaller and smaller in size and coming to use higher and higher signal frequencies. Under such circumstances, the wirings of those integrated circuits are also becoming thinner and thinner. If wirings are becoming thinner and thinner in such a way, forming a capacitance comes to be required between multi-layer wirings. Then, the wiring capacitance causes the signal delay time to be extended significantly. In order to suppress such extension of the signal delay time caused by the wiring capacitance, there have been some techniques developed to reduce the wiring capacitance. One of such techniques, which is widely known, uses a low dielectric constant film as an insulation film provided between wiring layers. When compared with the conventional oxide film used as interlayer films, the low dielectric constant film is generally low in thermal conductivity. When designing an integrated circuit, therefore, it becomes very important to take consideration to how to lower the heat generated from each wiring layer.

A current, when it flows in a wiring of an integrated circuit, comes to cause Joule's heat generation. If the temperature of the wiring rises excessively due to the Joule's heat generation, it results in lowering the reliability of the integrated circuit itself. This is why, when designing an integrated circuit, it is required to determine the wiring layout so as to suppress the influence of the Joule's heat generation effectively.

As a known technique for suppressing the Joule's heat generation, JP-A Hei8 (1996)-6980 (patent document 1) discloses "a power consumption estimating method".

This invention is intended to estimate wiring power consumption quickly and accurately using a prepared test pattern and without executing any simulations. In other words, the power consumption of a target wiring is calculated by a formula on the basis of a probability that the status of each input/output signal flowing in the target signal wiring might change (the probability denotes that a signal status changes to 0 or 1 and it is equivalent to a concept that the probability is equivalent to the frequency f of the subject signal flowing in the signal wiring).

In the known patent document 1, the current consumption I of the wiring capacitance C is focused and the power consumption of the target integrated circuit is estimated with use of a formula. Generally, the current consumption $I_n$ of a signal wiring n is calculated as $I_n = C_n \times V \times f_n$ by using the wiring capacitance $C_n$ of the signal wiring n, the signal voltage V, and the signal frequency $f_n$.

In this case, however, the voltage V is premised to be a fixed value. Consequently, the higher the probability that the input/output signal changes from 0 to 1 or from 1 to 0, the larger the current consumption I of the wiring capacitance C becomes, thereby the power consumption of the integrated circuit comes to increase.

The present inventors have recognized that the patent document 1 has the following problem.

If the power consumption of an integrated circuit is evaluated excessively, it comes to be required to widen the wiring width and secure a wider wiring pitch unnecessarily. This requires a wider area for the integrated circuit. This problem can be avoided, however, by taking consideration to various factors to prevent such excessive evaluation when evaluating a temperature rise to be caused by the Joule's heat generation in a designing process of the integrated circuit. In spite of this, if an attempt is made to estimate the power consumption of an integrated circuit by evaluating all of the wirings just like in the patent document 1, power consumption calculation is also required for each wiring of which temperature will not rise actually. This means that the power consumption of the integrated circuit in the patent document 1 is apt to be estimated excessively.

SUMMARY

In one aspect of the present application, the wiring layout method includes: designing a layout of a power wiring for an integrated circuit (S20); designing a layout of a plurality of signal wirings for the integrated circuit (S21); comparing a signal frequency of each of the signal wirings with a predetermined reference frequency (S22); classifying the signal wirings into a first group and a second group (S23 and S24); calculating an evaluation value of a temperature rise of the integrated circuit (S25); modifying the layouts of a power wiring and the signal wirings of the integrated circuit when the evaluation value is over a predetermined allowable value (S26 and S27). In the classifying the signal wirings (S23 and S24), the first group consists of the signal wirings having signal frequencies equal to or over the reference frequency and the second group consists of the signal wirings having signal frequencies under the reference frequency. In the calculating an evaluation value (S25), an estimated temperature rise in the integrated circuit is calculated by excluding the temperature rise caused by the power consumption of the signal lines classified into the first group.

In another aspect of the present application, the wiring layout program stored in a computer readable medium enables a computer to execute the wiring layout method (S20 to S27).

According to the present invention, the signal wirings are classified into two groups; one consisting of signal wirings having signal frequencies over the reference frequency and the other consisting of signal wirings having signal frequencies under the reference frequency. An estimated temperature rise in the integrated circuit is calculated by excluding the temperature rise caused by the power consumption of the signal wirings in the first group. In the signal wirings of the first group, signals having signal frequencies over the reference frequency are flowed. Those signals almost do not cause a temperature rise in those signal wirings even when a power is consumed in those signal wirings. Therefore the present invention can prevent excessive evaluation of the power consumption due to the signal wirings with respect to the temperature rise.

BRIEF DESCRIPTION OF THE DRAWINGS

The above and other objects, advantages and features of the present invention will be more apparent from the following description of certain preferred modes taken in conjunction with the accompanying drawings, in which.

DETAILED DESCRIPTION OF THE PREFERRED EMBODIMENTS

The invention is now described herein with reference to illustrative embodiments. Those skilled in the art would recognize that many alternative embodiments can be accomplished using the teachings of the present invention and that the invention is not limited to the embodiments illustrated for explanatory purposes.

First Embodiment

Figure 3:
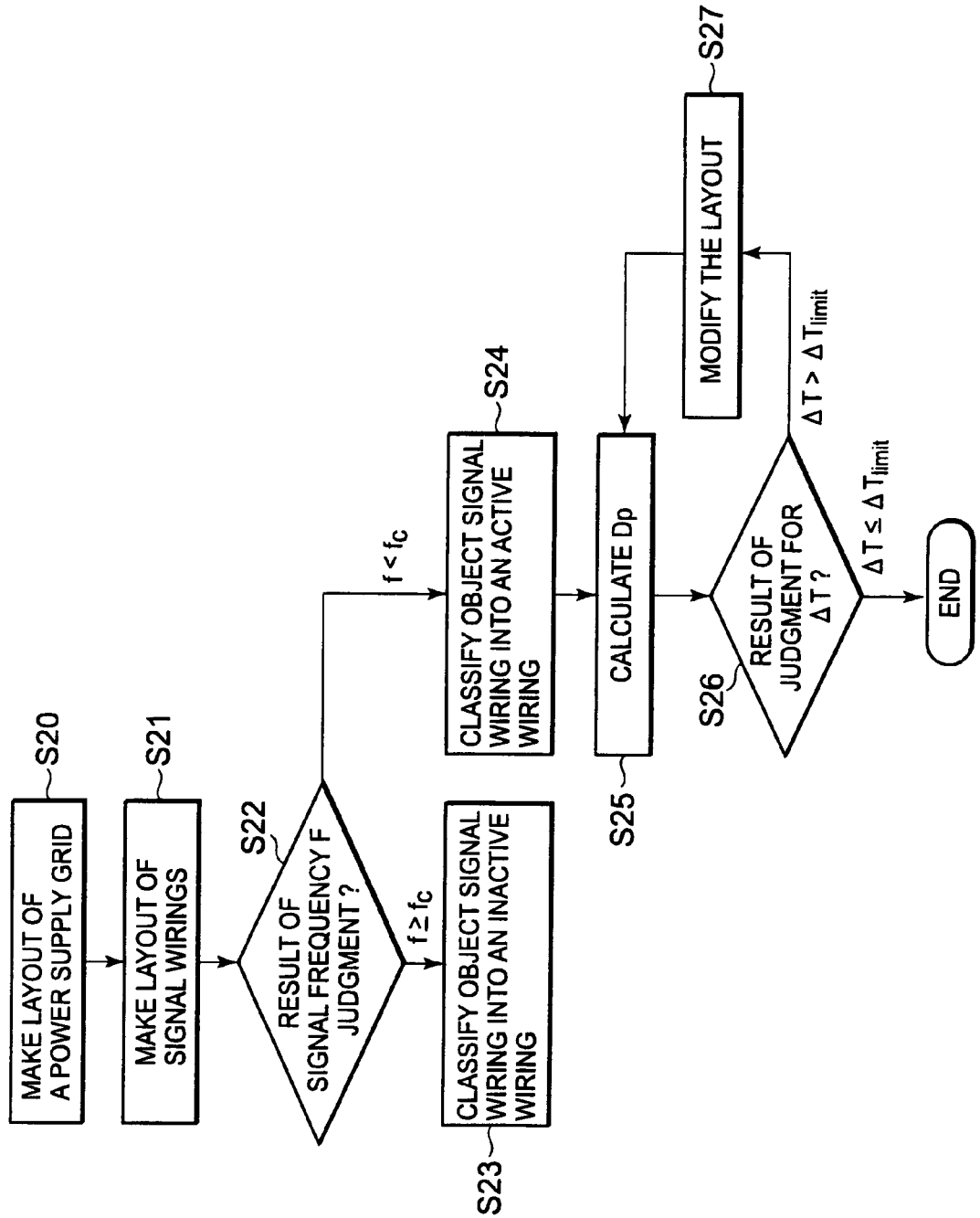
FIG. 3 is a flowchart of the processes for describing how to make the layout of the wirings in the first embodiment.

Next, there will be described the first embodiment of the present invention with reference to the accompanying drawings. FIG. 3 is a flowchart of the processes for laying out wirings in this first embodiment. Here, a CAD (Computer Aided Design) system is used to design the subject integrated circuit. The CAD system in this first embodiment is a computer that uses a CAD program. The flowchart of FIG. 3 shows a processing flow of the algorithm built in the CAD program.

The CAD system designs or performs the layout of the wirings of the integrated circuit in accordance with the inputs/commands of the designer. As shown in FIG. 3, at first, the designer makes the layout of the power wiring in the step S20. The power wiring supplies a voltage to each circuit block in the integrated circuit. Then, in the step S21, the designer makes the layout of the signal wirings. The signal wirings are used for realizing necessary logics. After that, the procedure for suppressing the Joule's heat generation is executed.

In the step S22, the signal frequency f for each of the signal wirings is calculated from each of the signal wirings. The signal frequency f for each of the signal wirings can be obtained through circuit simulations, etc. This signal frequency f is then compared with the predetermined reference frequency $f_c$. If the subject signal frequency f is equal to or over the reference frequency $f_c$, the wiring is classified into an "inactive wiring" (first group) for which it is not required to take consideration to the temperature rise $\Delta T$. If the signal frequency f is under the reference frequency $f_c$, the wiring is classified into an "active wiring" (second group) for which it is required to take consideration to the temperature rise $\Delta T$ in the step S24.

In the step S25, the power density $D_p$ is calculated from the power consumption of all the power wirings, the power consumption of the signal wirings classified into the "active wirings", and their area. In this step S25, the power consumption of the signal wirings classified into the "inactive wirings" is ignored. After this, in the step S26, it is determined from the power density $D_p$ calculated in the step S25 whether or not an estimated temperature rise $\Delta T_{limit}$ is over the allowable value $\Delta T_{limit}$. If the estimated temperature rise is over the allowable value $\Delta T_{limit}$, the layout made in the steps S20 and S21 is modified in the step S27 to reduce the power density $D_p$. The processings in steps S27→S25→S26 are repeated until the temperature rise $\Delta T$ of the integrated circuit is fit within the allowable value $\Delta T_{limit}$. When the temperature rise $\Delta T$ is within the allowable value $\Delta T_{limit}$, the layout of the wirings for suppressing the Joule's heat generation is completed.

In case of the present invention, it is premised that a wiring in which a signal with a signal frequency over the reference frequency $f_c$ flows is an "inactive wiring". And hereunder, there will be described the reason why no consideration is required for the temperature rise $\Delta T$ caused by the power consumption of the "inactive wiring" with use of a concrete example.

Figure 2:
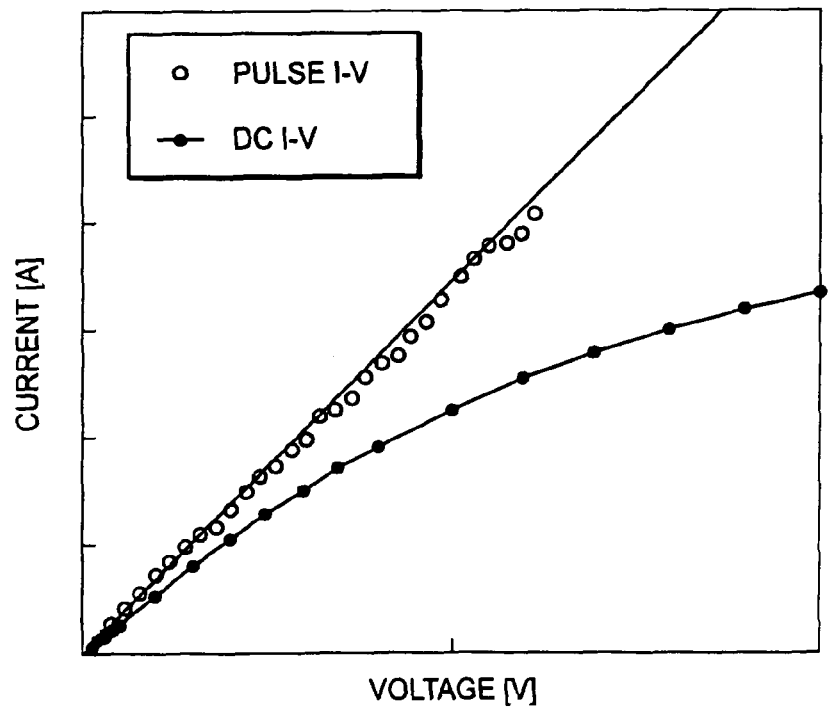
FIG. 2 is a graph for describing the voltage—current characteristics of those signal wirings.

FIG. 2 is a graph for describing the voltage—current characteristics of a wiring. In FIG. 2, comparing is made between a DC current graph (DC I-V) and a short (pulse width of around 100 ns) pulse current graph (pulse I-V). As shown in FIG. 2, in case of the DC current (DC I-V), the inclination in the low voltage area does not match with the inclination in the high voltage area and the current value of the high voltage area is off the trend in the low voltage area. It would be understood from FIG. 2 that the graph goes lower than the current extrapolation line of the low voltage area in accordance with an increase in the applied voltage. This characteristic appears in a case in which a current rise allows the Joule's heat generation to increase gradually, thereby the wiring resistance increases gradually.

In case of the short pulse (pulse width of around 100 ns) current (pulse I-V), however, as shown in FIG. 2, the wiring resistance to be possibly caused by the Joule's heat generation does not increase. This characteristic appears in a case in which the Joule's heat generation is suppressed. As to be understood from a case in which the time constant of the pulse current on/off is over the thermal response time constant of such metal as copper, aluminum, or the like used for wirings, in case of a pulse current that makes the temperature fall due to current falling before the temperature rise does not reach its peak, the temperature rise is suppressed more significantly than the temperature rise in the DC current. This means that if the half cycle ($=\frac{1}{2} f_c$; equivalent to an on or off pulse width) of the reference frequency $f_c$ is shorter than the time constant of the signal wiring thermal response, the signal wiring thermal response is delayed with respect to the signal on/off cycle ($1/f_c$). As a result, the signal wiring power consumption does not affect the signal wiring temperature rise. The thermal response time constant mentioned here means a time constant required between the time when a current flows to the signal wiring and the time when the signal wiring temperature rise is saturated.

Under such circumstances, the present invention takes consideration to the temperature falling specific to such a pulse current and excludes the temperature rise caused by the power consumption of the "inactive wirings" (the signal wirings classified into the first group).

According to the present invention, therefore, wirings are laid out by taking consideration to the temperature falling specific to the pulse current so as to avoid the excessive evaluation of the power consumption.

Figure 4:
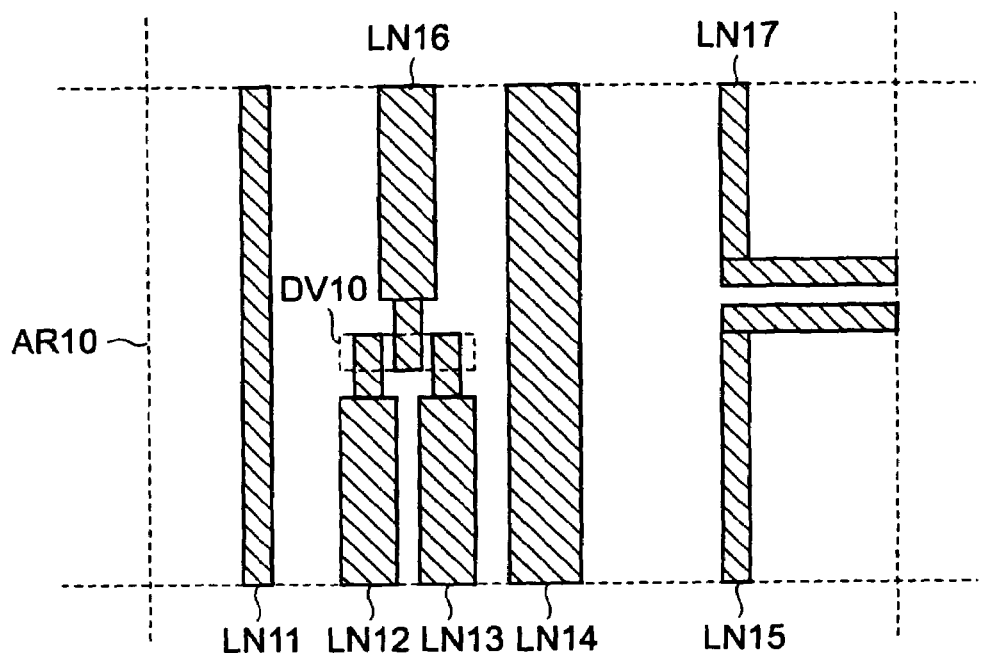
FIG. 4 is a diagram for describing how to calculate the power density $D_p$.

Next, there will be described how to calculate the power density $D_p$ with reference to FIG. 4. In the first embodiment, the integrated circuit layout area is divided into plural regions (divided layout regions) and the power density $D_p$ is calculated for each of those divided layout regions. FIG. 4 shows a case in which the processings in the steps (S20) of laying out the power wiring and (S21) of laying out signal wirings are ended, thereby one power wiring LN14 and six signal wirings LN11 to LN13 and LN15 to LN17 are laid out in one divided layout region AR10. The divided layout region AR10 includes a MOS field-effect transistor DV10 and the three terminals of the transistor DV10 are connected to the three signal wirings LN12, LN13, and LN16.

Then, the power density $D_p$ of this divided layout region AR10 is calculated. The signal frequencies $f_{LN11}$ to $f_{LN13}$ and $f_{LN15}$ to $f_{LN17}$ are obtained from the six signal wirings LN11 to LN13 and LN15 to LN17, respectively (S22). Then, each of those signal frequencies $f_{LN11}$ to $f_{LN13}$ and $f_{LN15}$ to $f_{LN17}$ is compared with the reference frequency $f_c$. As a result, the following results are obtained, for example.

Reference frequency $f_c$<signal frequency $f_{LN11}$
Reference frequency $f_c$>signal frequency $f_{LN12}$
Reference frequency $f_c$>signal frequency $f_{LN13}$
Reference frequency $f_c$>signal frequency $f_{LN15}$
Reference frequency $f_c$>signal frequency $f_{LN16}$
Reference frequency $f_c$>signal frequency $f_{LN17}$ In this case, the signal lines LN11, LN15, and LN17 having high signal frequencies $f_{LN11}$, $f_{LN13}$, and $f_{LN15}$ that are over the reference frequency $f_c$ are all classified into inactive wirings (S23). On the other hand, the signal wirings LN12, LN13, and LN15 having low signal frequencies $f_{LN12}$, $f_{LN13}$, and $f_{LN16}$ that are under the reference frequency $f_c$ are all classified into active wirings (S24). Finally, the power density $D_p$ of the divided layout region AR10 is calculated on the basis of the power consumption of one power wiring LN14 and the power consumption of the three active wirings (signal wirings LN12, LN13, and LN15).

Concretely, the power density $D_p$ of the divided layout region AR10 is calculated as follows (S25). At first, the wiring power consumption $W_i$ (i=LN12, LN13, LN14, and LN16) is calculated with use of the following equation.

Power consumption $W_i$=current density I×resistance R2

Next, the sum total of the power consumption $W_i$ is calculated as the power consumption $W_{AR10}$ of the divided layout region AR10.

Power consumption $W_{AR10}$=Σpower consumption $W_i$=power consumption $W_{LN12}$+power consumption $W_{LN13}$+power consumption $W_{LN14}$+power consumption $W_{LN16}$ The power consumption $W_{AR10}$ of the divided layout region AR10 calculated as described above is then divided by the area of the divided layout region AR10 to obtain the power density $D_p$ thereof.

In the first embodiment, the temperature rise $\Delta T_{AR10}$ in the divided layout region AR10 is measured to determine the temperature rise $\Delta T_{AR10}$ (S26). The temperature rise $\Delta T_{AR10}$ in the divided layout region AR10 can be calculated as a product of the power consumption $W_{AR10}$ of the divided layout region AR10 and the mean thermal resistance $R_{th}$ of the divided layout region AR10.

Temperature rise $\Delta T_{AR10}$=thermal resistance $R_{th}$× power consumption $W_{AR10}$ If the temperature rise $\Delta T_{AR10}$ of the divided layout region AR10 calculated as described above is over the predetermined allowable value Δlimit, the layout is modified (S27). The temperature rise $\Delta T_{limit}$ in each of the divided layout regions is not over the predetermined allowable value Δlimit, the layout is completed.

The reference frequency may be 0 Hz. In this case, the temperature rise of the integrated circuit comes to be evaluated only with the power consumption of the power wiring; the power of all the signal wirings is ignored. In many cases, however, the reference frequency should preferably be 10 kHz or over so that the temperature rise caused by the Joule's heat generation can be suppressed effectively.

The CAD program module that runs in accordance with the algorithm shown in FIG. 3 can be stored in a recording medium as a wiring layout program. When this layout program is loaded into the computer from the medium, the computer can function as a wiring layout system provided with eight functional blocks usable to execute the processings in the steps S20 to S27 shown in FIG. 3.

After this, the integrated circuit can be designed with use of the wiring layout method in the first embodiment. Then, according to the completed circuit design, the desired integrated circuit can be manufactured with use of any of known semiconductor production facilities.

Second Embodiment

Next, there will be described another (second) embodiment of the present invention in detail with reference to the accompanying drawings. The wiring layout method in the second embodiment is an improved version of the wiring layout method in the first embodiment. The step S22 of determining shown in FIG. 3 is modified in this second embodiment. Others (algorithm flows) are the same as those (S20, S21, and S23 to S27) in the first embodiment shown in FIG. 3.

Figure 5:
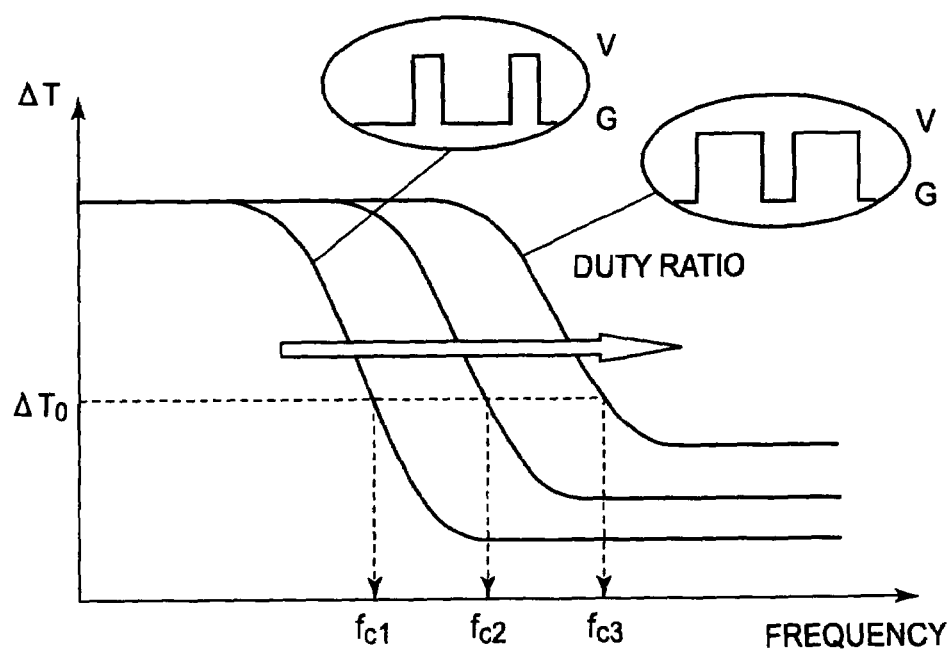
FIG. 5 is a graph for describing a step of judging in the second embodiment.

FIG. 5 shows a graph for describing the judging step (S22) in this second embodiment. The graph in FIG. 5 represents an explanatory relationship between each of three signal frequencies $f_{LNx}$ and its temperature rise $\Delta T_{LNx}$. In the graph, the horizontal axis denotes the frequency and the vertical axis denotes the temperature difference. The duty ratio means a rate of the period of the pulse width occupied in one pulse cycle when pulses have an ideal square waveform. For example, a high duty ratio means that the ON pulse width is wider than the OFF pulse width with respect to the time axis and a small duty ratio means its opposite state.

If the duty ratio of the pulse current flowing in a signal wiring becomes small, the temperature rise is suppressed more effectively due to the current falling, thereby the temperature rise is less affected by the subject wiring. As shown in FIG. 5, when the duty ratio is small, the graph comes to denote that the temperature rise is suppressed quickly in accordance with the increase in the frequency and the suppression level rises. On the other hand, if the duty ratio of the pulse current flowing in the signal wiring becomes large, the temperature rise comes to be affected more by the wiring. As shown in FIG. 5, when the duty ratio is large, the graph comes to denote that the temperature rise cannot be suppressed so much even when the frequency increases and the suppression range is narrowed.

If the circuit designer sets a proper value for the temperature rise allowable value $\Delta T_0$, the CAD system can obtain the reference frequency $f_{Cx}$ (for example, $f_{C1}$, $f_{C2}$, $f_{C3}$ in accordance with the duty ratio) with respect to each duty ratio from the graph shown in FIG. 5. The CAD program can generate the data used to draw such a graph automatically. On the other hand, the circuit designer can also generate the data separately beforehand and load it into the CAD system. As shown in FIG. 5, if the duty ratio is large, the reference frequency $f_{Cx}$ also increases. Therefore, the wiring signal frequency $f_{LNx}$ is required to be higher. Otherwise, the wiring cannot be classified into the "inactive wiring". If the duty ratio is small, the reference frequency $f_{Cx}$ also decreases. Thus the wiring is classified into the "inactive wiring" even when the wiring signal frequency $f_{LNx}$ is comparatively low.

In the judging step (improved from S22) in this second embodiment, the reference frequency is used as a function of the duty ratio of the pulse current flowing in each signal wiring. Thus the reference frequency $f_c$ in the first embodiment is replaced with the reference frequency $f_c(d)$ in this second embodiment, where d is a duty ratio. Hereunder, this will be described concretely with reference to FIG. 4. For example, the signal frequency $f_{LN11}$ is compared with the reference frequency $f_c(d_{LN11})$ in accordance with the duty ratio $d_{LN11}$, and the signal frequency $f_{LN12}$ is compared with the reference frequency $f_c(d_{LN12})$ in accordance with the duty ratio $d_{LN12}$. If the reference frequency $f_{c(d)}$ is used as the function of the duty ratio in such a way, the evaluation of whether to classify each wiring into the "inactive wiring" can be made more accurately. This is effective to lower the risk of excessive evaluation occurrence of power consumption.

Figure 6:
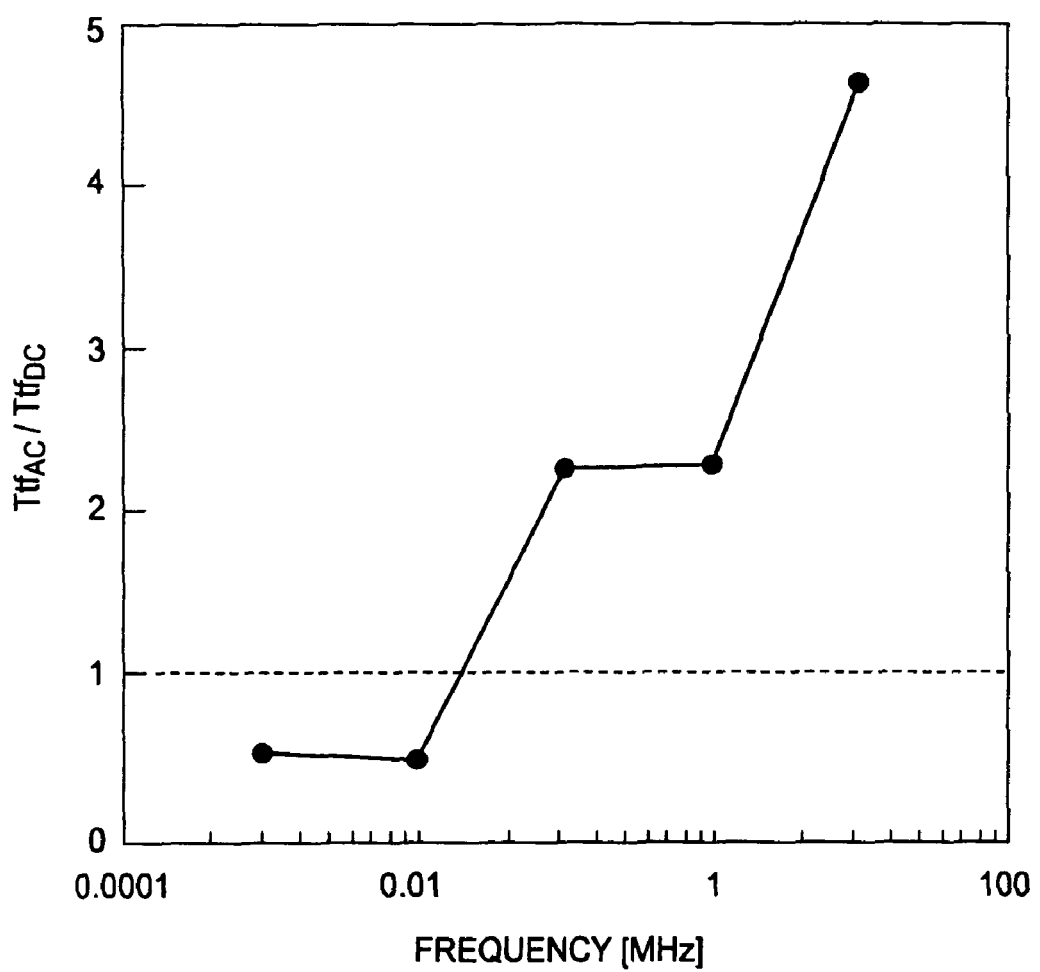
FIG. 6 is a graph for denoting a relationship between the wiring lifetime and the signal frequency.

Finally, there will be made a supplementary description for the reference frequency used in both the first and second embodiments. FIG. 6 is a graph for describing a relationship between the pulse current frequency and the wiring lifetime (Ttf: Time To Failure) when a constant pulse current flows in the subject wiring. In FIG. 6, a wiring lifetime test is carried out for each wiring flowing a pulse current having one of plural frequencies. Here, the peak value of the pulse current of each frequency is set so that the average current value becomes the same among the plural frequencies. The vertical axis in FIG. 6 denotes the ratio ($Ttf_{AC}/Ttf_{DC}$) between the wiring lifetime ($Ttf_{DC}$) during the DC current and the wiring lifetime ($Ttf_{AC}$) during a pulse current of each frequency.

As shown in FIG. 6, when the pulse current frequency is 10 kHz or over, it will be observed that the wiring lifetime is extended in two steps. In the first step, the extension is observed from 10 kHz to 100 kHz. This is known as the mitigation characteristic of the electro-migration. The frequency range from 100 kHz to 1 MHz is a plateau region. In the second step, the extension is observed in the range of 1 MHz or over. More concretely, the extension in the second step is observed from 1 MHz to 10 MHz. This range is considered to be a frequency band in which the Joule's heat generation can be suppressed remarkably. This frequency range is equivalent to that of the frequency of the pulse current of around 100 ns (pulse width of around 100 ns) so shown in FIG. 2. Consequently, the reference frequency should preferably be set within a range of 1 MHz to 10 MHz.

In the above cases, it is premised that a pulse current flows in each signal wiring. However, the current may not be such a pulse current only; any AC current will do to obtain the effect of the present invention.

Comparative Example

Figure 1:
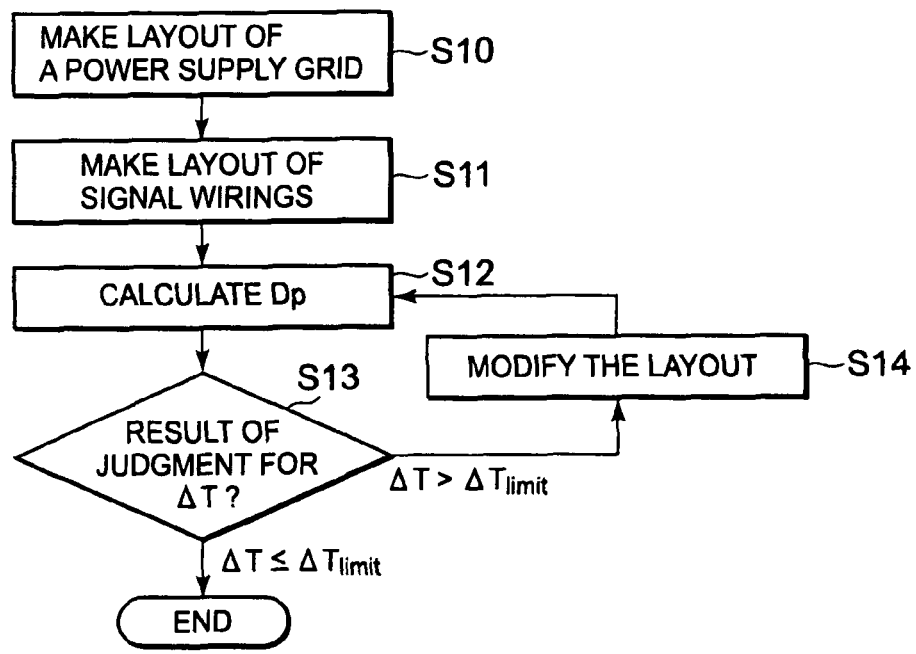
FIG. 1 is a flowchart of the processes for laying out signal wirings.

FIG. 1 is a flowchart of the processes of another layout method in a comparison example for describing the effect of the present invention.

The layout method shown in FIG. 1 includes a processing added to suppress the Joule's heat generation. Next, there will be described the flow of the algorithm in this case. At first, in step S10, a power wiring is laid out to supply a voltage to each circuit block. The power wiring is generally laid out in a grid pattern, so that the laid-out power wiring is also referred to as a power supply grid. Then, in step S11, signal wirings are laid out so as to realize necessary logics. After that, processings are executed to suppress the Joule's heat generation.

In step S12, the power density $D_p$ is calculated from the power consumption of all the power wirings and all the signal wirings and their area. Then, in step S13, it is determined according to the power density $D_p$ calculated in step S12 whether or not an estimated temperature rise $\Delta T$ exceeds the allowable value $\Delta T_{limit}$. If the power density $D_p$ exceeds the allowable value $\Delta T_{limit}$, the layout carried out in steps S10 and S11 is modified in step S14 to reduce the power density $D_p$. And the processings in steps from S14 through S12 to S13 are repeated until the temperature rise $\Delta T$ of the integrated circuit settles within the range of the allowable value $\Delta T_{limit}$. This completes the wiring layout for suppressing the Joule's heat generation.

In case of the layout method shown in FIG. 1, the power consumption of each signal wiring is calculated. As described above, according to the present invention, the temperature does not rise actually in some signal wirings in accordance with the signal frequency. This is why the wiring temperature rise comes to be estimated excessively if the Joule's heat generation amount is calculated with respect to each wiring. As a result of such excessive evaluation, the wiring width and the wiring pitch are required to be widen respectively to lower the wiring power density, thereby suppressing the excessively evaluated temperature rise. And such a layout change results in increases of the area of the integrated circuit and the chip manufacturing cost.

On the other hand, according to the present invention, the wiring temperature makes almost no rise. Furthermore, the Joule's heat generation from each signal wiring having a frequency over the reference frequency can be ignored to calculate the temperature rise on the basis of the Joule's heat generation only from the signal wirings having signal frequencies under the reference frequency respectively, that is, the temperature rise on the basis of the power consumption of each signal wiring. Consequently, when compared with the layout method shown in FIG. 1, the temperature rise of each wiring can be prevented from excessive evaluation and the area of the integrated circuit can be prevented from unnecessary increasing. The chip manufacturing cost can thus be reduced.

It is apparent that the present invention is not limited to the above embodiments, and the embodiments can be modified and changed as appropriate within the scope of the technical concept of the present invention.

What is claimed is:

1. A wiring layout method comprising:
    performing a layout of a power wiring for an integrated circuit;
    performing a layout of a plurality of signal wirings for the integrated circuit;
    comparing a signal frequency of each of the signal wirings with a predetermined reference frequency;
    classifying the signal wirings into a first group and a second group, the first group consisting of the signal wirings having signal frequencies equal to or over the reference frequency and the second group consisting of the signal wirings having signal frequencies under the reference frequency;
    calculating, by a processor, an evaluation value of a temperature rise of the integrated circuit by excluding the temperature rise caused by a power consumption of the signal wirings of the first group; and
    modifying, by a processor, the layouts of a power wiring and the signal wirings of the integrated circuit when the evaluation value is over a predetermined allowable value.

2. The wiring layout method according to claim 1, wherein, in the comparing the signal frequency, the reference frequency comprises a frequency determined in accordance with the duty ratio of a signal flowing in the signal wirings.

3. The wiring layout method according to claim 2, wherein, in the comparing the signal frequency, a frequency in a second range is used as the reference frequency when a wiring lifetime of the signal wirings for a pulse signal denotes an increase of a first stage as an increase in a frequency of a pulse signal within a first range of a frequency of a pulse signal due to the mitigation characteristic of the electro-migration and when the wiring lifetime of the signal wirings for a pulse signal denotes an increase of a second stage as an increase in a frequency of a pulse signal within the second range of a frequency of a pulse signal over the first range.

4. The wiring layout method according to claim 3,
wherein the wiring lifetime of the signal wirings for a pulse signal includes a plateau region between the increase of the first stage and the increase of the second stage as an increase in a frequency of a pulse signal,
wherein, the increase of the wiring lifetime in the plateau region as an increase in a frequency of a pulse signal is smaller than the increase of the first stage and the increase of the second stage, and
wherein the increase of the second stage is due to a suppression of the Joule's heat generation.

5. The wiring layout method according to claim 2,
wherein, in the comparing the signal frequency, the reference frequency comprises a frequency between 1 MHz and 10 MHz.

6. The wiring layout method according to claim 3,
wherein the calculating the evaluation value of the temperature rise includes dividing an area of the layout of the signal wirings into a plurality of divided layout regions, and
wherein, in the calculating the evaluation value of the temperature rise, the evaluation value of the temperature rise of the integrated circuit is calculated for each of the divided layout regions by excluding the temperature rise caused by the power consumption of the signal wirings of the first group.

7. The wiring layout method according to claim 3,
wherein the calculating the evaluation value of the temperature rise includes:
dividing an area of the layout of the power wiring and the layout of the signal wirings into a plurality of divided layout regions;
calculating a total power consumption of the power wiring and the signal wirings of the second group for each of the divided layout regions;
calculating a power density by dividing the total power consumption by an area of each of the divided layout regions, for each of the divided layout regions; and
calculating the evaluation value on the basis of the power density for each of the divided layout regions.

8. The wiring layout method according to claim 7,
wherein the modifying the layouts includes modifying the layouts of a power wiring and the signal wirings when the evaluation value in any of the divided layout regions is over the predetermined allowable value.

9. The wiring layout method according to claim 1,
wherein the reference frequency $f_c$ has a half cycle ($=\frac{1}{2}f_c$) that is under the time constant of the thermal response of the signal wirings.

10. A computer readable, non-transitory medium storing a wiring layout program executed by a computer, the wiring layout program comprising:
performing a layout of a power wiring for an integrated circuit;
performing a layout of a plurality of signal wirings for the integrated circuit;
comparing the signal frequency of each of the signal wirings with a predetermined reference frequency;
classifying the signal wirings into a first group and a second group, the first group consisting of signal wirings having signal frequencies equal to or over the reference frequency and the second group consisting of signal wirings having signal frequencies under the reference frequency;
calculating an evaluation value of a temperature rise of the integrated circuit by excluding the temperature rise caused by a power consumption of the signal wirings of the first group; and
modifying the layouts of a power wiring and the signal wirings of the integrated circuit when the evaluation value is over a predetermined allowable value.

* * * * *